United States Patent
Watanabe et al.

(10) Patent No.: US 7,418,685 B2
(45) Date of Patent: Aug. 26, 2008

(54) LAYOUT METHOD FOR MINIATURIZED MEMORY ARRAY AREA

(75) Inventors: Yuko Watanabe, Tokyo (JP); Koji Arai, Tokyo (JP); Seiji Narui, Tokyo (JP)

(73) Assignees: Elpida Memory, Inc., Tokyo (JP); Hitachi Ulsi Systems, Co., Ltd., Tokyo (JP); Hitachi Ltd., Tokyo (JP)

( * ) Notice: Subject to any disclaimer, the term of this patent is extended or adjusted under 35 U.S.C. 154(b) by 83 days.

(21) Appl. No.: 10/875,572

(22) Filed: Jun. 25, 2004

(65) Prior Publication Data
US 2005/0028125 A1 Feb. 3, 2005

(30) Foreign Application Priority Data
Jun. 27, 2003 (JP) .............................. 2003-184012

(51) Int. Cl.
G06F 9/455 (2006.01)
G06F 17/50 (2006.01)

(52) U.S. Cl. ...................................................... 716/11

(58) Field of Classification Search ............. 716/10–11; 430/311; 438/129
See application file for complete search history.

(56) References Cited

U.S. PATENT DOCUMENTS

| | | | |
|---|---|---|---|
| 5,976,929 A * | 11/1999 | Kajigaya et al. ............. | 438/241 |
| 6,352,896 B1 * | 3/2002 | Liu et al. ..................... | 438/253 |
| 6,713,231 B1 * | 3/2004 | Hasegawa et al. ............ | 430/311 |
| 6,845,042 B2 * | 1/2005 | Ichige et al. ............ | 365/185.17 |
| 6,867,092 B2 * | 3/2005 | Uchiyama et al. ............ | 438/244 |
| 2002/0045134 A1 * | 4/2002 | Inoue et al. .................. | 430/311 |
| 2002/0076919 A1 * | 6/2002 | Peters et al. ................. | 438/637 |
| 2002/0155661 A1 * | 10/2002 | Massingill et al. ........... | 438/244 |
| 2002/0158273 A1 * | 10/2002 | Satoh et al. .................. | 257/211 |
| 2003/0001214 A1 * | 1/2003 | Yoshida et al. ............... | 257/390 |
| 2003/0132479 A1 * | 7/2003 | Nakamura et al. ........... | 257/315 |
| 2003/0183418 A1 * | 10/2003 | Castro et al. ................. | 174/260 |

FOREIGN PATENT DOCUMENTS

| | | |
|---|---|---|
| CN | 1349258 A | 5/2002 |
| JP | S62-141558 A | 6/1987 |
| JP | H10-142769 A | 5/1998 |
| JP | 2000-267258 A | 9/2000 |

* cited by examiner

Primary Examiner—Jack Chiang
Assistant Examiner—Suresh Memula
(74) Attorney, Agent, or Firm—Sughrue Mion, PLLC

(57) ABSTRACT

Bit lines and a pair of two tungsten wires having the same widths are formed at a portion where a through-hole is to be formed such that the bit lines and the tungsten wires are arranged at regular intervals. A through-hole for connection to another wiring layer is formed between the tungsten wires. A connection wiring made of tungsten is formed over the through-hole so as to have a predetermined margin around the through-hole. In a photolithography process, a slit having a small width enough to be insensitive to a photo-resist is formed so as to span the through-hole.

16 Claims, 10 Drawing Sheets

LAYOUT METHOD FOR MINIATURIZED MEMORY ARRAY AREA

BACKGROUND OF THE INVENTION

1. Field of the Invention

The present Invention relates to a layout method for patterning wires substantially in parallel on one wiring layer having, in a memory array area, a connecting hole for connection to wires on another wiring layer.

2. Description of the Related Art

In today's semiconductor processes, miniaturization is promoted to make the total size smaller. Also, in a memory array area, as memory cells are miniaturized, the wire width and the line spacing are made smaller. However, a device section having, for example, a sense amplifier, a sub-word driver, or a transfer gate is not miniaturized as much as the memory cell section. Thus, the difference in shrink ratio between the memory cell section and the device section has been growing year by year.

For example, in the folded bit memory array area shown in FIG. 1, cells 1, bit lines 2, word lines 3, sense amplifiers (hereinafter, abbreviated as SAs) 4, sub-word drivers (hereinafter, abbreviated as SWs) 5, and other control lines are arranged. A plurality of bit lines 2 and a plurality of word lines 3 are arranged vertically and horizontally, respectively, in the drawing. The cells 1 are two dimensionally disposed at the intersections of the vertical bit lines 2 and the horizontal word lines 3. One cell 1 is disposed at each of the intersections. Each of the cells 1 is realized by, for example, a dynamic memory cell composed of a transistor and a cell capacitor. Many pairs of complementary lines of True and Bar define the bit lines 2. Each pair of the bit lines 2 is connected to one of the SAs 4 arranged, for convenience of the layout area, in a comb-shaped or staggered manner in the upper or lower part of one cell array in the drawing.

Here, in the folded bit-line type, two complementary bit lines 2 are arranged on one side of an SA 4. Furthermore, here, a shared method is adopted where an array of two cells 1 shares an SA 4. However, an open bit-line method is also acceptable where complementary bit lines are arranged on both sides of an SA 4.

The word lines 3 can be regarded as sub-word lines, and made of, for example, low-resistant polysilicon. One end of each of the word lines 3 is connected to an SW circuit, so that the word line 3 is driven by the corresponding SW 5. The same number of SWs 5 as word lines 3 is provided. Each of the SWs 5 is constructed so as to operate according to AND logic between one main word-line and each of sub-word drive lines.

In this manner, the bit lines 2 are arranged in one direction (i.e., in the up/down direction in the drawing) of the cell array section of memory cells arranged two dimensionally. The word lines 3 are arranged in the direction perpendicular to the direction in which the bit lines 2 are arranged. In short, the word lines 3 are arranged in the left/right direction in the drawing. Furthermore, the SA area and the SW area are arranged in the up/down direction and the left/right direction of the bit lines 2, respectively, such that the SA area and the SW area are adjacent to each other. Although not shown in FIG. 1, data read from the cells 1 or data written to the cells 1 is input/output via a common local I/O (hereinafter, abbreviated as LIO) line disposed adjacent to the SAs 4.

One layout is defined by a plurality of sets of the circuit shown in FIG. 1 stacked one on another in the up/down direction and side by side in the left/right direction.

FIG. 2 shows the structure of one switch of a transfer gate (hereinafter, abbreviated as a TG) section 6. The TG section 6 connects a pair of complimentary bit lines 2 and an SA 4 included in the memory array area shown in FIG. 1. The bit lines 2 extending in the up/down direction in the drawing of FIG. 1 extend in the left/right direction in FIG. 2. The size of the memory array area will now be described in detail with reference to FIGS. 3 to 5.

FIG. 3 shows an example of a known layout of a wiring pattern in a memory array area. This layout includes a plurality of sets of the circuit shown in FIG. 1. The bit lines in FIG. 3 extend in the left/right direction in the drawing, unlike the bit lines in FIG. 1. Each of the SAs is disposed between a pair of two complementary bit lines, one upper and the other lower. The SAs are arranged at intervals in the left/right direction and adjacent to one another in the up/down direction. In the layout shown in FIG. 3, the wire portions having thereon connecting holes indicated by black squares are thick and long. Furthermore, in the layout, a margin for photolithography is ensured by arranging two thin wires functioning as bit lines, on both sides of one thick wire.

In the example of FIG. 3, the wires seem to be laid out regularly. With a closer look, however, bit lines extending in parallel In the left/right direction are bent in the up/down direction in some portions, such as close to connecting hole portions and transfer gate sections connected to bit lines at the left and right ends. Thus, in this layout, wires are thick in some portions and are thin in other portions. For this reason, although described below, the resolution of a photoresist decreases due to a proximity effect in the resist process of photolithography of wiring when the photoresist is exposed to light. This is likely to cause a short circuit. Furthermore, in this layout, thick wires extending a long way cause the resolution of a photoresist to decrease in many portions. This is more likely to cause a short circuit. To overcome this problem, in the known layout, a short margin is improved by ensuring wider space between a thick wire and adjacent thin wires than between thin wires.

Margins will now be described with reference to FIGS. 4 and 5. FIG. 4 is a partially enlarged schematic diagram of connecting holes in FIG. 3 and their proximity, whereas FIG. 5 is a partially enlarged schematic diagram of a connecting hole in FIG. 4 and its proximity. Thus, relative dimensions in the drawings are not necessarily identical to those described below.

In the current manufacturing process, bit lines 101, as thin wires, can have a wire width of 0.12 µm. Furthermore, a bit line space between a bit line 101 and a neighboring bit line 101 (also having a wire width of 0.12 µm) can be made as small as 0.12 µm. On the other hand, a connecting hole 103 connecting between wiring layers Is disposed at the center of a thick wire 102 and has a span of 0.20 µm. For the resist process of photolithography, a margin of 0.08 µm is ensured between the connecting hole 103 and the thick wire 102 to prevent a short-circuit to the gate or the diffusion layer of the transistor disposed therebelow. Therefore, the thick wire 102 has a total wire width of 0.36 µm.

As the above-described short margin, a thick line space of 0.14 µm is ensured between the thick wire 102 and its adjacent bit lines 101 (referred to as a thick line space). This thick line space is wider than the bit line space of 0.12 µm between the bit lines 101. As a result, the pitch of the connecting hole 103, calculated as the sum of these values, is 1.00 µm.

FIG. 6 shows the TG section 6 in FIG. 3. This TG section includes a TG which is realized by a transfer MOS (metal oxide semiconductor) connecting bit lines 2 and the SA 4 shown in FIG. 1. For this purpose, a transfer MOS is required for each of the bit lines. In addition, the flexibility of layout is restricted because a diffusion layer is arranged In the same portion as the bit lines adjacent to the memory cell. The width of the diffusion layer is an important factor that affects the driving capacity of the MOS as a device. Therefore, the width of the diffusion layer should be maximized in order to ensure a stable operation of the circuit.

Thus, because the widths of wires 121 and the line spacing between the wires 121 in a diffusion layer become variable in the layout, a wide space is formed between diffusion layers in the photolithography process of the diffusion layers, in the same manner as in the above-described layout More specifically, taking into consideration a connecting hole 122 with a span of 0.16 μm, a margin of 0.08 μm is ensured, in the resist process of photolithography, between the connecting hole 122 and the thick wire 121 to prevent a short circuit to the gate or the diffusion layer of the transistor disposed therebelow. Therefore, the thick wire 121 has a total width of 0.32 μm. In the known layout, a space of 0.18 μm is required between the thick wires 121, because the thick wires 121 are disposed adjacent to each other. In short, the pitch between the connecting holes 122 is calculated as 0.50 μm from the sum of these values.

The above-described known layout method for a memory array area is still problematic in that the shrink ratio as a result of miniaturization is not sufficient.

The reason is as follows. In the vicinity of wires requiring a large thickness, such as wires at a connecting hole, parallel wires are disposed less regularly, and this causes the margin to decrease in photolithography processing. As a result, an electrical short circuit is likely to occur, and therefore, a large space to the side of thick wires is required.

Here, FIG. 5 is referred to for the minimum standard width F according to the minimum design rule used as the standard width in microfabrication. When the minimum standard width F is defined as the wire width of the thin wires 101 or the bit line space between the thin wires 101, i.e., 0.12 μm, the pitch width of the sense amplifier section requires a standard width eight times that of the minimum design rule, i.e., 8F=0.96 μm. In this case, the difference from the above-described pitch width of 1.00 μm is 0.04 μm.

When the width of the thick wire 102 is to be adjusted to achieve a layout where the existing pitch of 1.00 μm is reduced to a pitch of 8F=0.96 μm in this SA section, the thick wire width is reduced from 0.36 μm to 0.32 μm. Therefore, the wiring margin between the connecting hole 103 and the wire is reduced from the existing margin of 0.08 μm to 0.06 μm. In the resist process of photolithography in this case, a thick line space of 0.14 μm is ensured, and hence, the short margin of thick wires is improved. However, due to a decrease in the wiring margin as a side effect, the connecting hole deviates from the thick wire. This causes a short circuit to the gate or the diffusion layer of the transistor disposed therebelow. For this reason, the manufacturing yield will decrease.

In addition, wires neighboring the memory cells have many bent portions as shown in the layout of FIG. 3. In general, these bent portions cannot be processed in complete compliance with the design in a resist process. More specifically, these bent portions of wires are beveled and rounded in many cases. Thus, thin wires which are bent in many portions are likely to break in the worst case. This is disadvantageous in processing.

In addition, with reference to FIG. 6, if the TG pitch of 0.50 μm is adjusted down to 4F=0.48 μm, i.e., a value four times the minimum standard width F=0.12 μm used in other portions, a line spacing can be ensured only 0.16 μm. With this line spacing, the space between diffusion layers becomes small in the photolithography process of the diffusion layer, and hence the resolution of a photoresist undesirably decreases due to a proximity effect. This is likely to cause a short circuit.

If the wiring margin or size shift is taken into consideration, these factors will place a severe restriction on the layout, and this decreases the manufacturing yield. When miniaturization is achieved and, accordingly, the difference in shrink ratio of wire width between the memory cell and the array area circuit becomes more considerable, the layout will become more difficult

SUMMARY OF THE INVENTION

Accordingly, in order to overcome the above-described problems, an object of the present invention is to provide a layout method for a memory array area for miniaturizing thick wires in a device section, such as a sense amplifier section or a transfer gate section to achieve a high shrink ratio.

A layout method according to an aspect of the present invention relates to the formation of wires substantially in parallel on one wiring layer having in a memory array area a connecting hole for connection to wiring on another wiring layer. The layout method includes forming the wires at the same intervals so that the wires have the same widths and are arranged at regular pitches, and forming the connecting hole between two adjacent wires so that the connection wiring connects the two adjacent wires electrically.

With this layout method, the portion associated with the connecting hole for a contact plug or a via plug is restricted to the proximity of the connecting hole. This advantageously achieves a minimum wiring margin around the connecting hole. The connecting hole is a contact hole which is a hole or a window for connecting the diffusion layer or the gate layer of a transistor to the wiring on the upper layer. Otherwise, the connecting hole is a through-hole which is a hole or a window formed on an inter-layer insulating film to connect the upper-layer wiring to the lower-layer wiring.

The layout method may further include covering the connecting hole with a connection wiring to form a thick wire portion. In the direction perpendicular to the direction in which the wires extend, the thick wire portion can be reduced in relation to the width and line spacing of the wires extending in parallel. Furthermore, the connection wiring spanning the parallel wires can have a minimum wiring margin in the length direction of the parallel wires.

In the layout method, the ratio of L/S may be one, where L represents the width of the wire and S represents the space between any two adjacent wires. If the wires are bit lines and the ratio L/S is one, a layout with a pitch eight times the minimum standard width F for minimum manufacturing can be achieved by forming the connecting hole for a sub-word driver section or a sense amplifier section between adjacent wires.

In the layout method, the connection wiring spanning two adjacent wires may be a thick wire which covers two connecting holes arranged side by side on a center line of the connection wiring. With this structure, thick wires used to connect bit lines with a MOS, such as wires in a transfer gate section, can be patterned with a pitch four times the minimum standard width F for minimum manufacturing.

In the layout method, a slit is preferably formed at the center of the connection wiring in a photolithography process such that the slit has a length direction parallel to the length direction of the wires and has a small width enough to be insensitive to a photoresist. With this slit, the size of a pattern formed around the connecting holes can be changed in small steps. In other words, miniaturized wires can be patterned with a high accuracy.

DESCRIPTION OF THE PREFERRED EMBODIMENTS

Figure 1:
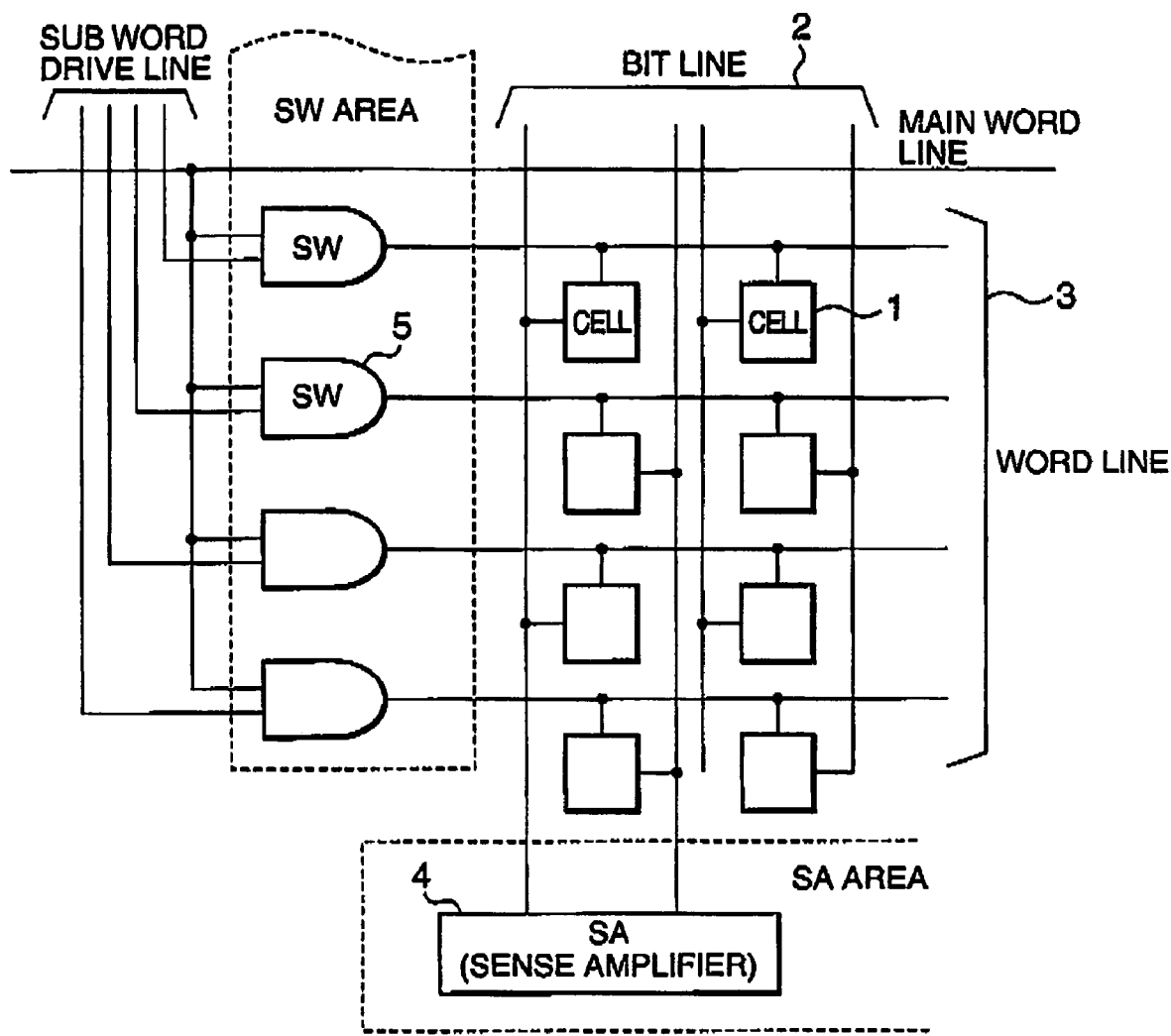
FIG. 1 is an illustration for an example of a circuit including a sense amplifier section and a sub-word drive section in the target memory array area.

Embodiments according to the present invention will now be described in detail with reference to the attached drawings.

In a memory array area to which the present invention is applied, for example, in the above-described folded bit memory array area shown in FIG. 1, cells 1, bit lines 2, word lines 3, sense amplifiers (hereinafter, abbreviated as SAs) 4, sub-word drivers (hereinafter, abbreviated as SWs) 5, and other control lines are arranged. A plurality of bit lines 2 and a plurality of word lines 3 are arranged vertically and horizontally, respectively, in the drawing. The cells 1 are two dimensionally disposed at the intersections of the vertical bit lines 2 and the horizontal word lines 3. One cell 1 is disposed at each of the intersections. Each of the cells 1 is realized by, for example, a dynamic memory cell composed of a transistor and a cell capacitor. Many pairs of complementary lines of True and Bar define the bit lines 2. Each pair of the bit lines 2 is connected to one of the SAs 4 arranged, for convenience of the layout area, in a comb-shaped or staggered manner in the upper or lower part of one cell array in the drawing.

Here, in the folded bit-line type, two complementary bit lines 2 are arranged on one side of an SA 4. Furthermore, a shared method is adopted where an array of two cells 1 shares an SA 4. However, an open bit-line method is also acceptable where complementary bit lines are arranged on both sides of an SA 4.

The word lines 3 can be regarded as sub-word lines, and made of, for example, low-resistant polysilicon. One end of each of the word lines 3 is connected to an SW circuit, so that the word line 3 is driven by the corresponding SW 5. The same number of SWs 5 as word lines 3 is provided. In this embodiment, each of the SWs 5 is constructed so as to operate according to AND logic between one main word-line and one of sub-word drive lines.

In this manner, the bit lines 2 are arranged in one direction (i.e., in the up/down direction in the drawing) of the cell array section of memory cells arranged two dimensionally. The word lines 3 are arranged in the direction perpendicular to the direction in which the bit lines 2 are arranged. In short, the word lines 3 are arranged in the left/right direction in the drawing. The SA area and the SW area are arranged in the up/down direction and the left/right direction of the bit lines 2, respectively, such that the SA area and the SW area are adjacent to each other.

One layout is defined by a plurality of sets of the circuit shown in FIG. 1 stacked one on another in the up/down direction and side by side in the left/right direction.

Figure 2:
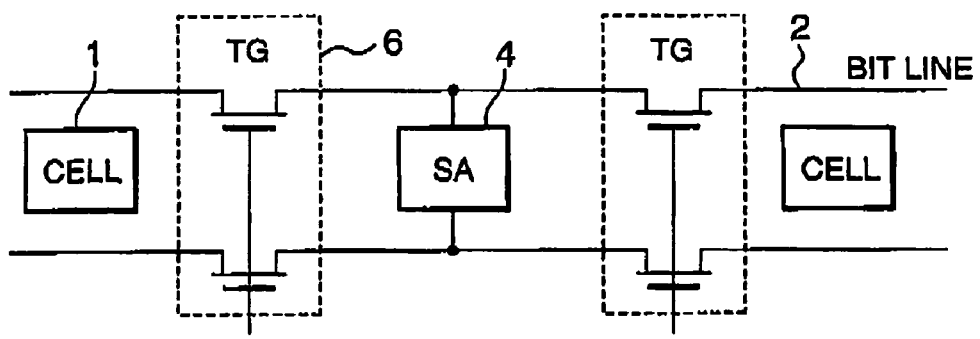
FIG. 2 is an illustration for an example of a circuit including a transfer gate section in the target memory array area.
Figure 3:
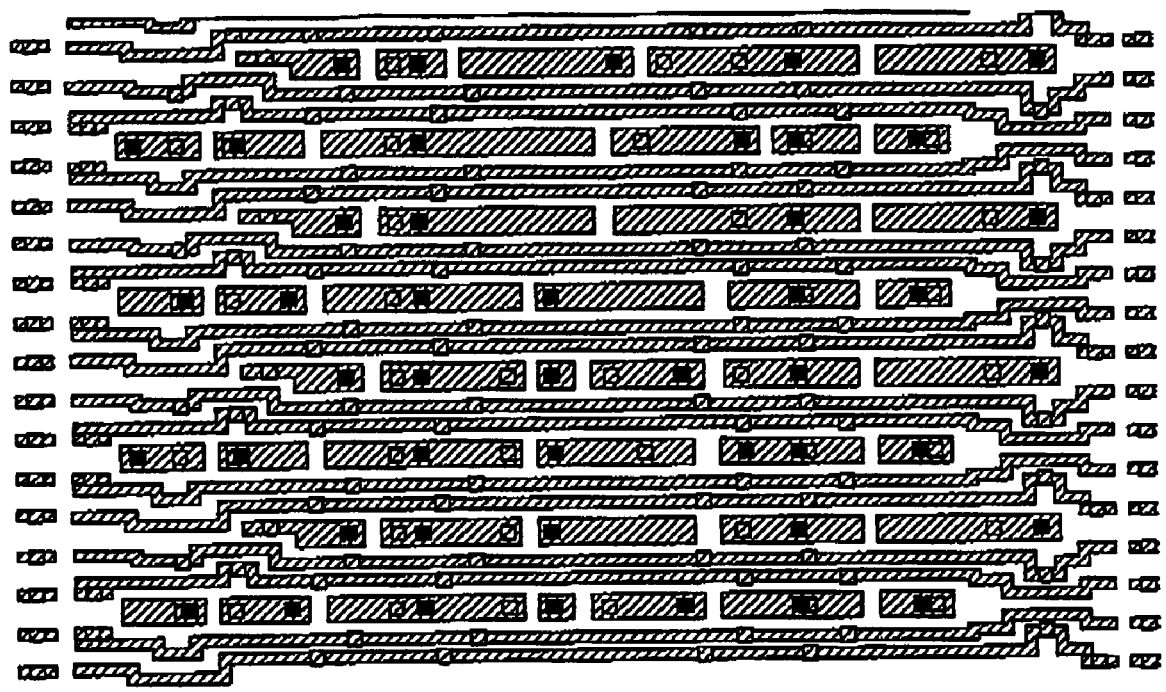
FIG. 3 is an illustration for an example of a known layout in a memory array area.
Figure 4:
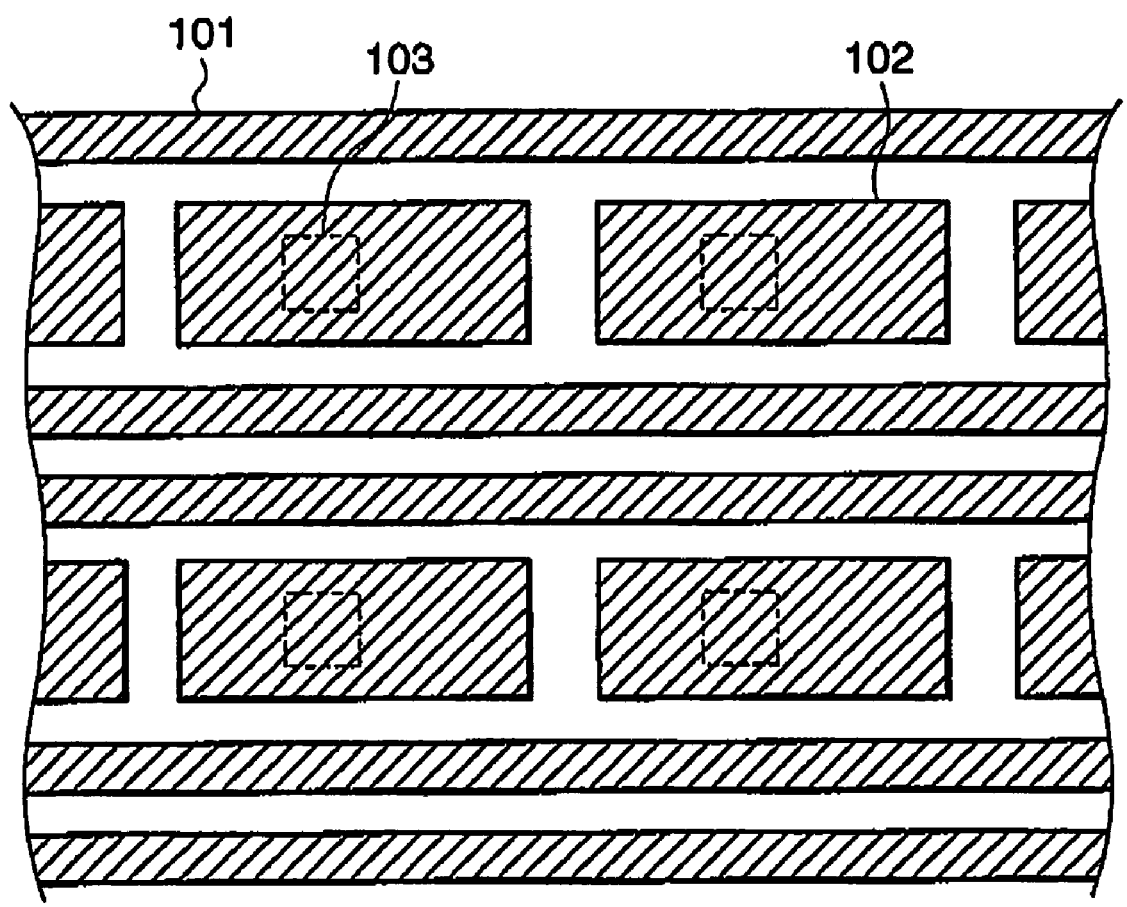
FIG. 4 is a partially enlarged layout of sense amplifiers in FIG. 3.
Figure 5:
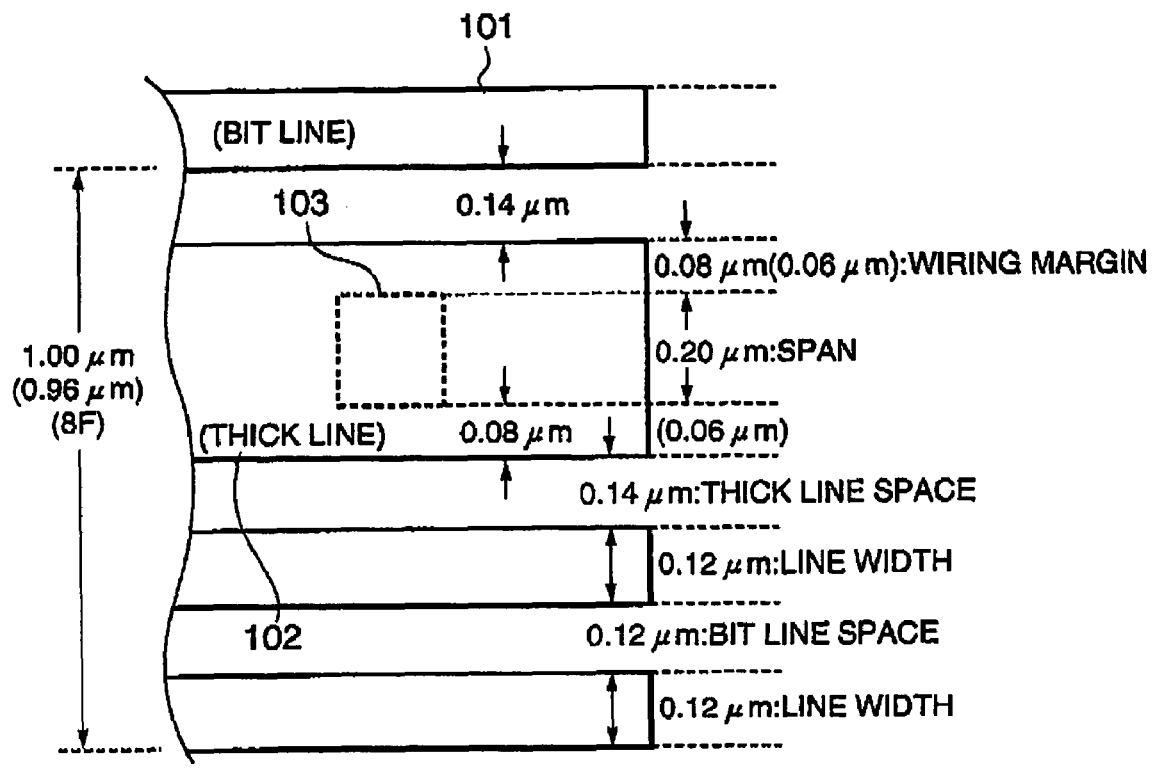
FIG. 5 is a partially enlarged schematic diagram of a connecting hole in FIG. 3 and its proximity.
Figure 6:
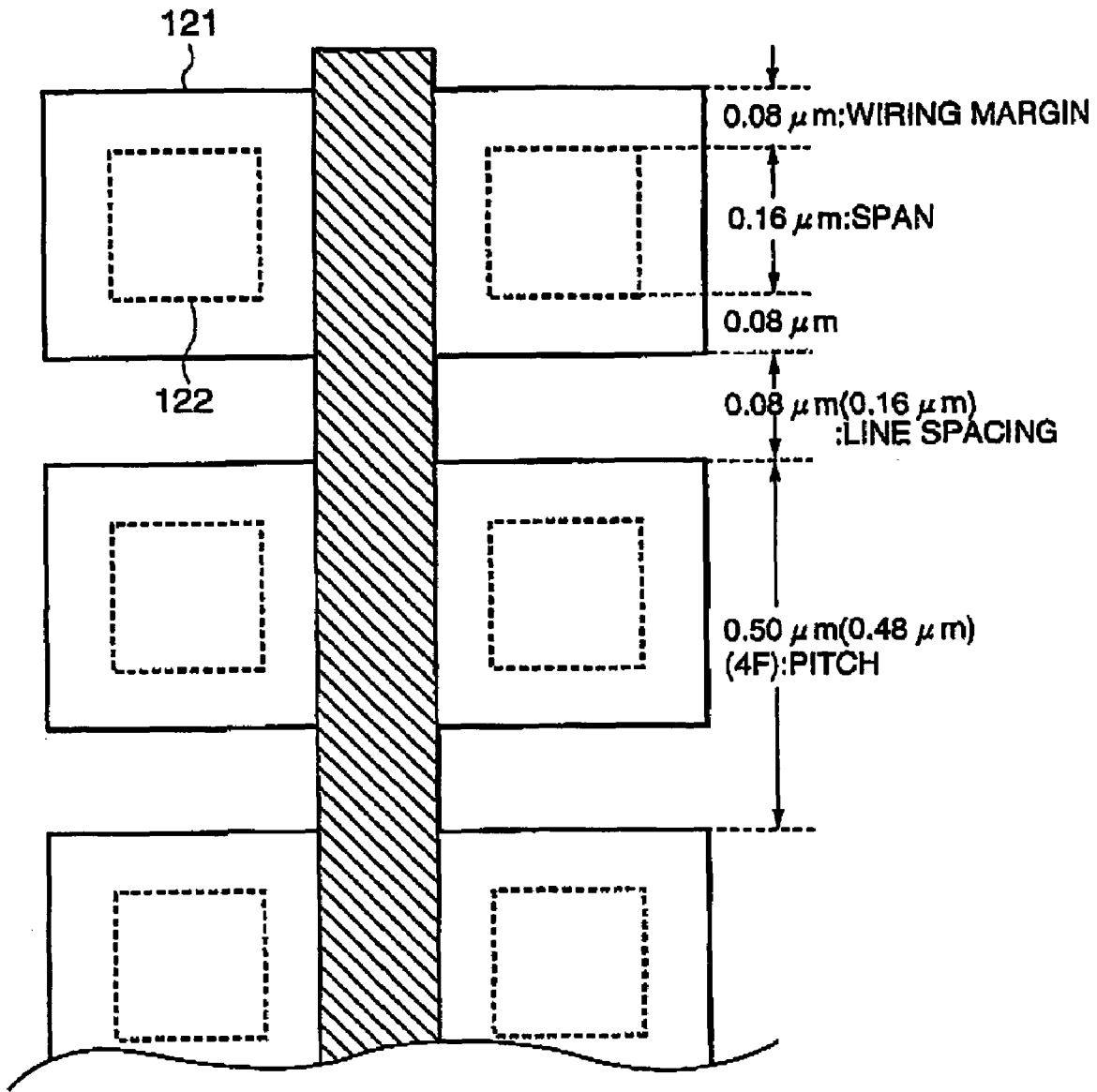
FIG. 6 Is a partially enlarged schematic diagram of the transfer gate section in FIG. 4.

FIG. 2 shows the structure of one switch of a transfer gate (hereinafter, abbreviated as a TG) section 6. The TG section 6 connects a pair of complimentary bit lines 2 and an SA 4 included in the memory array area shown in FIG. 1. The bit lines 2 extending in the up/down direction in the drawing of FIG. 1 extend in the left/right direction in FIG. 2.

Figure 7:
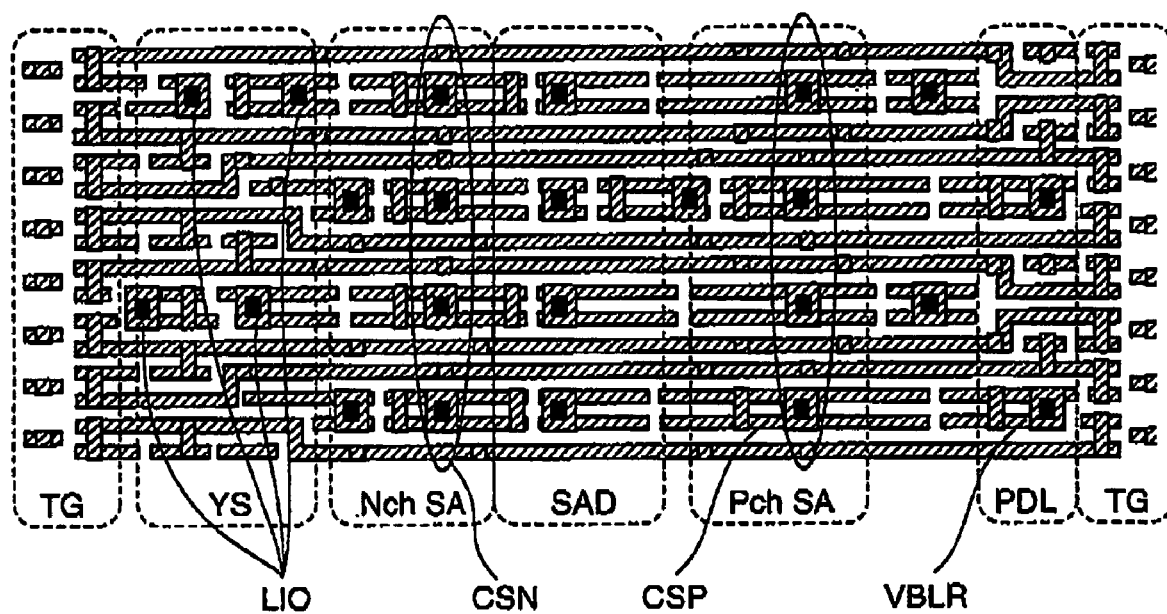
FIG. 7 is an illustration for a layout for a memory array area according to an embodiment of the present invention.

A layout of a memory array area will now be described with reference to FIG. 7. FIG. 7 shows a layout for a memory array area according to an embodiment of the present invention. This layout includes a plurality of sets of the circuit shown in FIG. 1.

The bit lines in FIG. 7 extend in the left/right direction in the drawing, unlike the bit lines in FIG. 1. In each of the N-channel and P-channel SA sections, the wiring portion connected at each connecting hole indicated by a black square is disposed between a pair of two complementary bit lines, one upper and the other lower. A TG section connects the bit lines at the left and right ends in the drawing, and is formed between two adjacent parallel wires. A wire spanning over two wires, as described above, is called a connection wiring.

In the memory array area including the memory array and its peripheral circuits, wires in a TG section, an SA section, or an SW section (hereinafter, referred to as tungsten wires as distinct from bit lines) have the same wire width as bit lines and are arranged in parallel at the same intervals as bit lines. A tungsten wire refers to a wire of general conductive material, e.g., a high melting point metal, such as tungsten or tantalum, or its suicide. The name "tungsten" is used because such a wire is made of tungsten in many cases.

For example, in the tungsten wiring in an SA section in FIG. 7, many tungsten wires with the same wire width as bit lines are formed in parallel at the same intervals as bit lines in the up/down direction in the drawing, and are divided in the left/right direction in the drawing. In FIG. 7, one SA section includes four wires including a connecting hole and four spaces thereabove (or therebelow). This connecting hole connects tungsten on the lower layer with upper wiring. For the layout of this sense amplifier, the connecting hole is connected to tungsten on the lower layer and an LIO (local input/output) line, a CSN line, a CSP (common source) line, or a VBLR power line. The LIO line is used to carry out input/output with the upper data line. The CSN line and the CSP line set a bit line in the H (high) level or the L (low) level. The VBLR power line precharges a bit line to the half potential when the operation of the sense amplifier ends.

More specifically, at portions having a connecting hole for connecting wiring layers in an SA section, an SW section, or a TG section, the connecting hole is disposed between tungsten wires with the same wire width as the two bit lines. Furthermore, tungsten as a connection wiring is disposed so as to cover the portion of the connecting hole. This increases margins for lithography, and offers an advantage in that the manufacturing yield can be increased.

Figure 8:
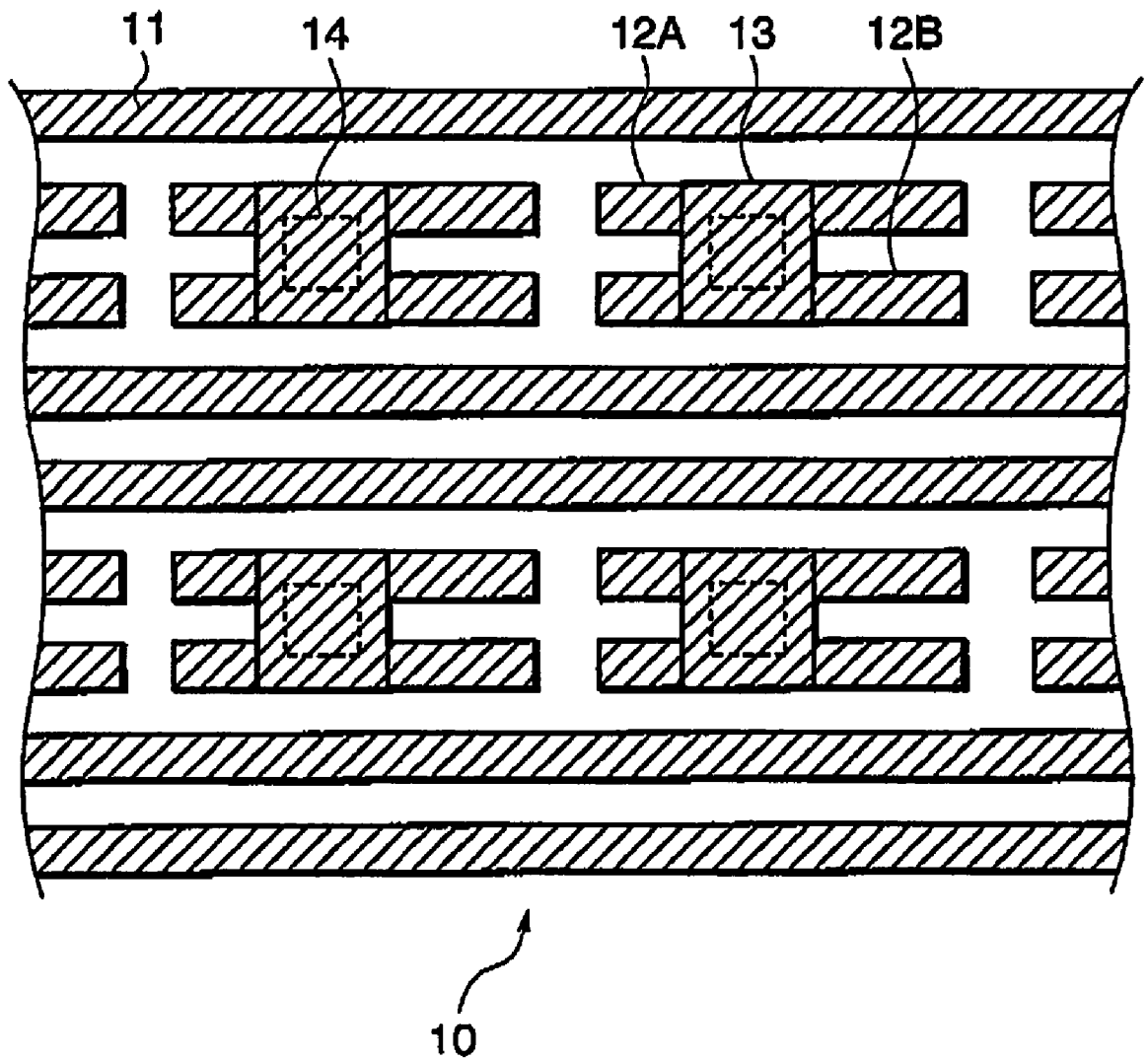
FIG. 8 is a partially enlarged layout for sense amplifier sections in FIG. 7.
Figure 9:
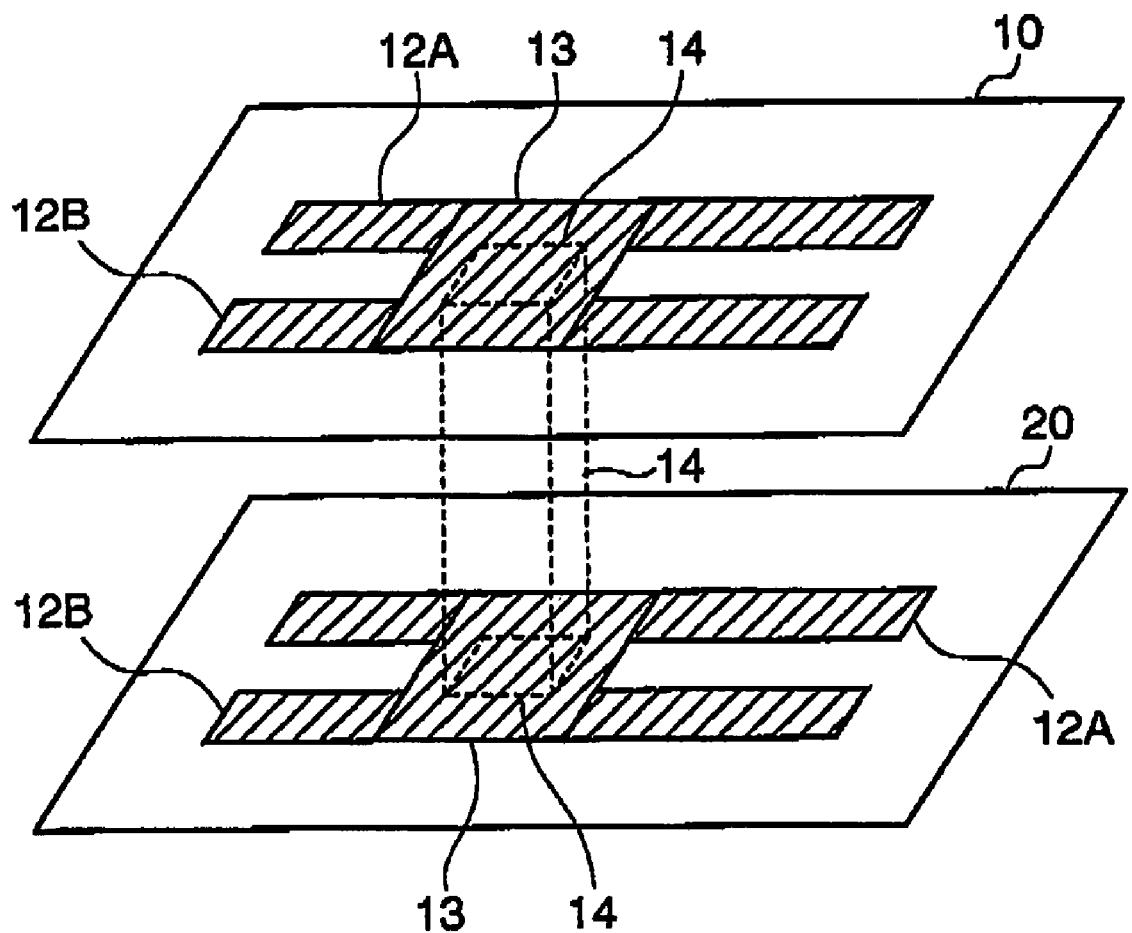
FIG. 9 is a perspective view of two layouts of sense amplifier sections for FIG. 8.

A layout in an SA section according to the present invention, as shown in FIG. 7, will now be described with reference to FIGS. 8 and 9. FIG. 8 is a partially enlarged layout 10 of SA sections in FIG. 7. FIG. 9 is a partially enlarged schematic diagram of connecting holes in FIG. 8 and their proximity. Thus, relative dimensions in the drawings are not necessarily identical to those described below.

The layout 10 for the memory array area shown in FIG. 8 represents SA sections. A pair of two tungsten wires 12A and 12B in parallel adjacent to bit lines 11 forms one thick wire for the SA as a basic unit. Each of the bit lines 11 and tungsten wires 12A and 12B extend straight in the horizontal direction in the drawing. The bit lines 11 and tungsten wires 12A and 12B have the same wire width and are arranged in parallel at the same intervals in the vertical direction. A connection wiring 13 connected to a link with another wiring layer 20 (Shown in FIG. 9) is formed the tungsten wires 12A and 12B forming a thick wire portion. More specifically, the connection wiring 13 is connected to the wiring on another wiring layer via the link. The link is a connector plug formed of an electric conductor placed into a through-hole (TH) 14 as the connecting hole.

Figure 10:
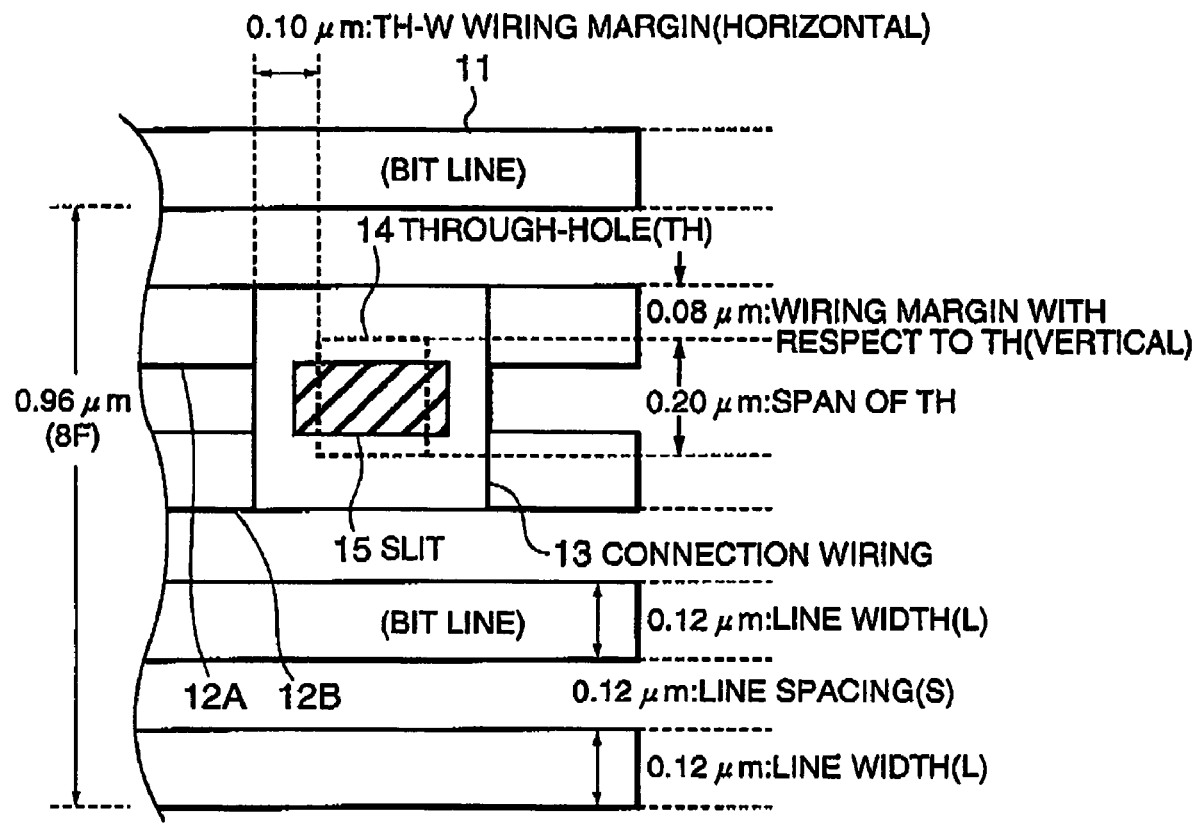
FIG. 10 is a partially enlarged schematic diagram of connecting holes in FIG. 8 and their proximity.

The dimensions of the through-hole 14 and its proximity will now be described in detail with reference to FIG. 10. Here, the tungsten wires 12A and 12B extend in the left/right direction as shown in FIG. 10.

The two bit lines 11 and a pair of tungsten wires 12A and 12B defining a thick wire can be arranged in parallel with a wire width L of 0.12 µm and a line spacing S of 0.12 µm, as in the above-described memory cell section.

The through-hole 14 in the thick wire portion has an aspect ratio of "0.20 µm/0.20 µm" as the standard, and is disposed at the center of the space (0.12 µm) between the neighboring tungsten wires 12A and 12B. Therefore, when the through-hole 14 Is formed at this position, the vertical margin on each of the tungsten wires 12A and 12B is "0.08 µm". A margin of this size can be achieved without difficulty taking into consideration a ratio L/S of 0.12 µm/0.12 µm between the width L and the line spacing S in FIG. 10.

Therefore, miniaturization down to eight times the minimum standard width F can be achieved if one thick wire of tungsten and two bit lines are combined. More specifically, a pattern layout where the pitch between the through-holes 14 is "0.96 µm", i.e., eight times the minimum standard width F of "0.12 µm", can be achieved. The horizontal margin on the connection wiring 13 covering the through-hole 14 disposed at the center thereof can be of the same size as before, i.e., "0.10 µm".

In order to achieve a layout having such a wiring pattern, a slit 15 that is too small to resolve is provided in the photolithography process of tungsten when a wiring pattern of this layout is formed. The slit 15 has a small width enough to be insensitive to a photoresist, for example, 0.08 µm. This slit 15 is disposed at the center of the connection wiring 13, so as to extend in the length direction of the two tungsten wires 12A and 12B and to span the through-hole 14.

With this slit 15, the thick wire is seemingly veiled, and this advantageously enables a tungsten layout to be formed regularly. As a result, the short margin can be improved.

Figure 11:
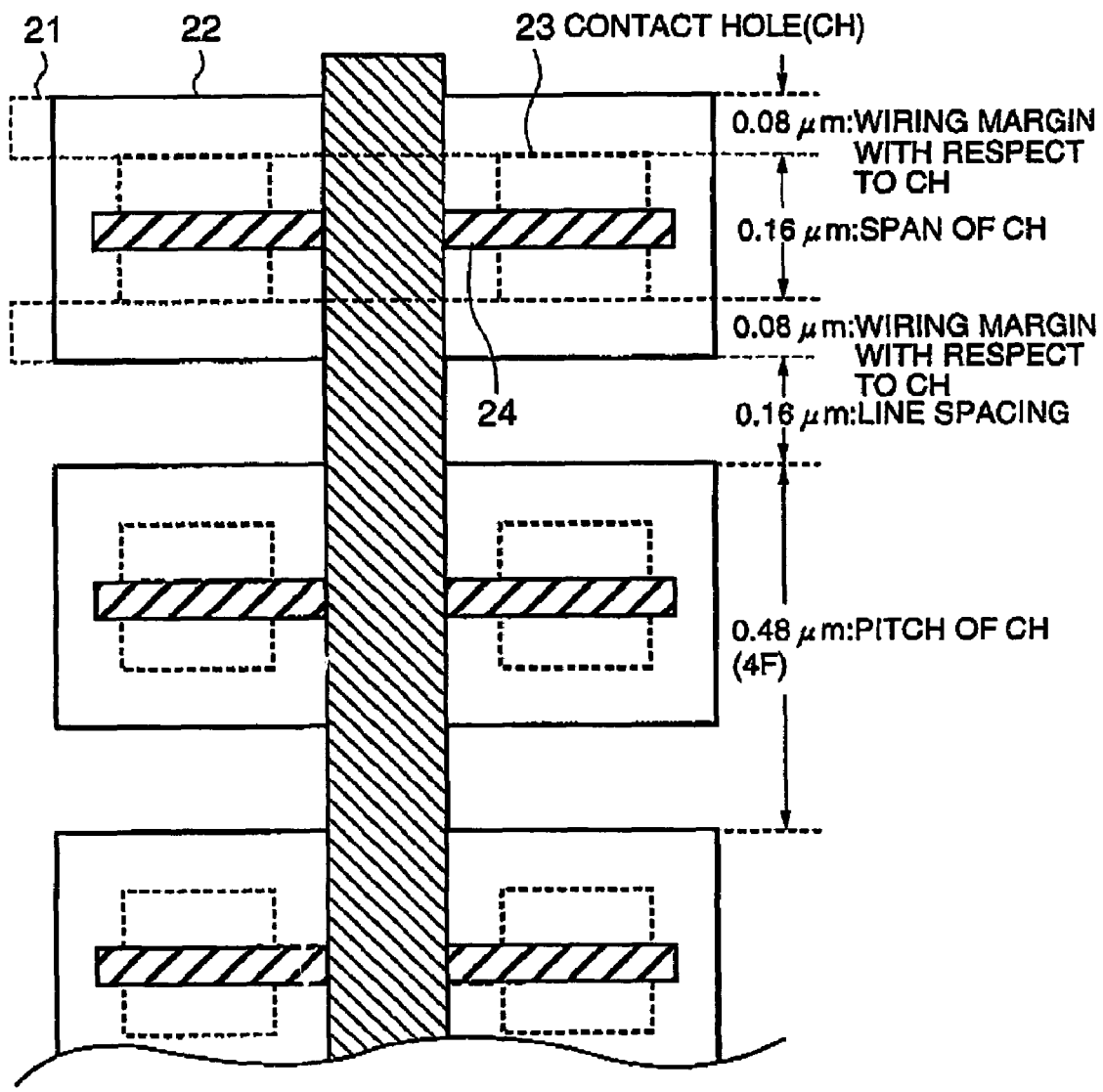
FIG. 11 is a partially enlarged schematic diagram of a transfer gate section in FIG. 7.

A layout of a TG section will now be described with reference to FIG. 11.

A thick wire is formed over contact holes (CHs) 23, as connecting holes, arranged side by side in the left/right direction in the drawing. In this embodiment, two parallel tungsten wires 21 each having a wire width of 0.08 µm are overlapped by a connection wiring 22 connected to contact plugs in the contact holes 23. A thick wire is defined by this connection wiring 22. In short, each connection wiring 22 over the contact holes 23 can be regarded as a thick wire. Thus, a plurality of such thick wires having the same width is laid out at regular intervals of 0.16 µm. When the minimum standard width F is defined as 0.12 µm, i.e., a value identical to the width described in relation to the above-described SA section, the contact hole pitch can be made to be 0.48 µm, i.e., a value four times the minimum standard width F With this structure, each of the contact holes 23, as connecting holes, is formed at a position between two tungsten wires 21.

In addition, with this structure, when the wiring margin on the connection wiring 22 with respect to the contact holes 23 is made to be 0.08 µm as in FIG. 9, the contact hole pitch can be made to be 0.48 µm because the span of the contact holes 23 and the line spacing is each 0.16 µm. In other words, the connection wiring 22 of tungsten having a wire width of, for example, 0.32 µm is laid out in the vertical direction in the drawing at intervals of, for example, 0.16 µm so as to overlap the contact holes 23 therebelow.

Furthermore, in pattern formation for the layout of this connection wiring 22, a slit 24 that is too small to resolve is provided in the photolithography process of tungsten for forming a wiring pattern of this layout, in the same manner as described with reference to FIG. 9. The slit 24 has a small width enough to be insensitive to a photoresist, for example, 0.07 µm. The slit 24 is disposed at the center of the connection wiring 22 so as to extend along the row of the two contact holes 23 and to span the two contact holes 23.

With this slit 24, the widths and distances of the diffusion layers in the TG section can seemingly be made substantially identical to one another. This prevents the resolution of a photoresist from decreasing in the photolithography process of the diffusion layers.

Although the present invention has been described in relation to a sense amplifier section and a transfer gate section, the layout method according to the present invention can be applied to any memory array area that satisfies the conditions described below. That is, the present invention can be applied to portions described below. One is, thin parallel wires having an identical width are arranged at short regular intervals. Another one is, a thick wire is required like at a connecting hole portion. And a connection wiring made of, for example, tungsten spans over two wires adjacent to one or two through-hole positions.

What is claimed is:

1. A layout method for forming a plurality of wires substantially in parallel on one wiring layer, having in a memory array area at least one connecting hole for connecting at least one of the plurality of wires to wiring on another wiring layer, the method comprising:

forming the plurality of wires at the same intervals, the plurality of wires having the same widths and being arranged at regular pitches; and forming said at least one connecting hole between two adjacent wires of the plurality of wires; and forming a wiring connecting the two adjacent wires to the connecting hole;

covering said at least one connecting hole with a connection wiring in a wire pattern; and forming a slit with a length direction parallel to the length direction of the plurality of wires at a center of the connection wiring using a photolithography process.

2. The layout method according to claim 1, wherein the ratio of L/S is one, where L represents the width of the plurality of wires and S represents the wire spacing between any two adjacent wires.

3. The layout method according to claim 1, wherein the connection wiring spanning two adjacent wires covers two of said connecting holes, the two connecting holes being arranged side by side on a center line of the connection wiring.

4. The layout method according to claim 1, wherein the at least one connecting hole and the at least two adjacent wires are formed in a same wiring layer.

5. The layout method according to claim 1, wherein the slit has a width from 0.07 micrometers to 0.08 micrometers.

6. The layout method according to claim 1, wherein the at least one connecting hole is formed at a center of a space between the two adjacent wires, and a width of each of the plurality of wires is 0.12 micrometers, a spacing between any two adjacent wires of the plurality of wires is 0.12 micrometers, and an area of each of the at least one connecting hole is 0.20 micrometers squared.

7. A layout method for forming a plurality of wires substantially in parallel on one wiring layer, having in a memory array area at least one connecting hole for connecting at least one of the plurality of wires to wiring on another wiring layer, the method comprising:
    forming the plurality of wires at the same intervals, the plurality of wires having the same widths and being arranged at regular pitches;
    forming said at least one connecting hole between two adjacent wires of the plurality of wires, and
    covering said at least one connecting hole with a connection wiring in a wire pattern,
    wherein the connection wiring spanning two adjacent wires covers two of said connecting holes, the two connecting holes being arranged side by side on a center line of the connection wiring, and
    wherein a slit is formed at a center of the connection wiring using a photolithography process, the slit having a length direction parallel to the length direction of the plurality of wires.

8. A wiring layer, having in a memory array area at least one connecting hole for connecting at least one of a plurality of wires to wiring on another wiring layer, the wiring layer comprising:
    the plurality of wires formed substantially in parallel and at the same intervals on the wiring layer, the plurality of wires having the same widths and being arranged at regular pitches; and
    a wiring connecting the two adjacent wires to the connecting hole,
    wherein said at least one connecting hole is formed between two adjacent wires of the plurality of wires;
    wherein said at least one connecting hole is covered with a connection wiring in a wire pattern; and
    wherein a center space of the connection wiring has a slit with a length direction parallel to the length direction of the plurality of wires at a center of the connection wiring, the slit being formed using a photolithography process.

9. The wiring layer according to claim 8, wherein the ration of L/S is one, where L represents the width of the plurality of wires and S represents the wire spacing between any two adjacent wires.

10. The wiring layer according to claim 8, wherein the connection wiring spanning two adjacent wires covers two of said connecting holes, the two connecting holes being arranged side by side on a center line of the connection wiring.

11. The wiring layer according to claim 8, wherein the at least one connecting hole and the at least two adjacent wires are formed in a same wiring layer.

12. A wiring layer, having in a memory array area at least one connecting hole for connecting at least one of a plurality of wires to wiring on another wiring layer, the wiring layer comprising:
    the plurality of wires formed substantially in parallel and at the same intervals on the wiring layer, the plurality of wires having the same widths and being arranged at regular pitches;
    wherein said at least one connecting hole is formed between two adjacent wires of the plurality of wires and covered with a connection wiring in a wire pattern,
    wherein the connection wiring spanning two adjacent wires covers two of said connecting holes, the two connecting holes being arranged side by side on a center line of the connection wiring, and
    wherein a center space of the connection wiring has a slit formed at a center of the connection wiring using a photolithography process, the slit having a length direction parallel to the length direction of the plurality of wires.

13. A layout method in a memory array area, the method comprising:
    forming a plurality of wires, arranged at regular pitches, each of the plurality of wires having a same width;
    forming at least one connecting hole between two adjacent wires of the plurality of wires;
    forming a wiring coupling the two adjacent wires to the connecting hole; and
    forming a slit with a length direction parallel to a length direction of the plurality of wires at a center of the wiring coupling the two adjacent wires to the connecting hole using a photolithography process.

14. The layout method of claim 13, wherein the plurality of wires, the at least one connecting hole, and the wiring are formed on a same layer.

15. The layout method of claim 13, wherein the slit has a width from 0.07 micrometers to 0.08 micrometers.

16. The layout method of claim 13, wherein the at least one connecting hole is formed at a center of a space between the two adjacent wires, and a width of each of the plurality of wires is 0.12 micrometers, a spacing between any two adjacent wires of the plurality of wires is 0.12 micrometers, and an area of each of the at least one connecting hole is 0.20 micrometers squared.

* * * * *